United States Patent
Oishi et al.

(10) Patent No.: US 10,658,416 B2
(45) Date of Patent: May 19, 2020

(54) IMAGE SENSOR AND METHOD FOR MANUFACTURING IMAGE SENSOR

(71) Applicant: HUAIAN IMAGING DEVICE MANUFACTURER CORPORATION, Huaian, Jiangsu (CN)

(72) Inventors: Amane Oishi, Jiangsu (CN); Xiaolu Huang, Jiangsu (CN)

(73) Assignee: HUAIAN IMAGING DEVICE MANUFACTURER CORPORATION, Huaian (CN)

( * ) Notice: Subject to any disclaimer, the term of this patent is extended or adjusted under 35 U.S.C. 154(b) by 36 days.

(21) Appl. No.: 16/022,988

(22) Filed: Jun. 29, 2018

(65) Prior Publication Data
US 2019/0237502 A1    Aug. 1, 2019

(30) Foreign Application Priority Data

Jan. 30, 2018    (CN) .......................... 2018 1 0086092

(51) Int. Cl.
*H01L 27/146* (2006.01)
*H01L 29/66* (2006.01)
*H04N 5/369* (2011.01)
*H01L 31/18* (2006.01)
*H01L 31/028* (2006.01)
(Continued)

(52) U.S. Cl.
CPC .... *H01L 27/14643* (2013.01); *H01L 27/1461* (2013.01); *H01L 27/1464* (2013.01); *H01L 27/14612* (2013.01); *H01L 27/14623* (2013.01); *H01L 27/14636* (2013.01); *H01L 27/14689* (2013.01); *H01L 29/6656* (2013.01); *H01L 29/66545* (2013.01); *H01L 29/7835* (2013.01); *H01L 31/028* (2013.01); *H01L 31/1037* (2013.01); *H01L 31/1812* (2013.01); *H04N 5/369* (2013.01)

(58) Field of Classification Search
None
See application file for complete search history.

(56) References Cited

U.S. PATENT DOCUMENTS

| 7,989,859 B2* | 8/2011 | Mao ............... H01L 27/14625 257/233 |
| 9,431,452 B1* | 8/2016 | Liu ................ H01L 27/14645 |

(Continued)

FOREIGN PATENT DOCUMENTS

| CN | 1553513 A | 12/2004 |
| CN | 101640210 A | 2/2010 |

(Continued)

OTHER PUBLICATIONS

Chinese Office Action dated Jan. 22, 2019, in corresponding Chinese Application No. 201810086092.8 (7 pages).

Primary Examiner — Lex H Malsawma
(74) Attorney, Agent, or Firm — Bookoff McAndrews, PLLC

(57) ABSTRACT

An image sensor may include a semiconductor substrate in which a photodiode is formed; a metal interconnection layer located above the semiconductor substrate; and an absorption layer located between the semiconductor substrate and the metal interconnection layer, wherein the absorption layer is configured to absorb light travelling through the semiconductor substrate.

10 Claims, 10 Drawing Sheets

(51) Int. Cl.
*H01L 31/103* (2006.01)
*H01L 29/78* (2006.01)

(56) References Cited

U.S. PATENT DOCUMENTS

| | | | | |
|---|---|---|---|---|
| 2006/0086956 A1* | 4/2006 | Furukawa | ............ | H01L 27/1462 257/291 |
| 2012/0241895 A1* | 9/2012 | Kurogi | .............. | H01L 27/14603 257/437 |
| 2013/0134535 A1* | 5/2013 | Lenchenkov | ..... | H01L 27/14627 257/432 |
| 2016/0181294 A1* | 6/2016 | Zhao | ................... | H01L 27/1462 257/292 |

FOREIGN PATENT DOCUMENTS

| CN | 101989608 A | 3/2011 |
|---|---|---|
| CN | 102334189 A | 1/2012 |
| CN | 102446936 A | 5/2012 |
| CN | 102693990 A | 9/2012 |
| CN | 103367381 A | 10/2013 |
| CN | 106298818 A | 1/2017 |
| CN | 106328663 A | 1/2017 |

\* cited by examiner

IMAGE SENSOR AND METHOD FOR MANUFACTURING IMAGE SENSOR

CROSS-REFERENCE TO RELATED APPLICATIONS

This application claims priority to Chinese Patent Application No. 201810086092.8, filed on Jan. 30, 2018, which is hereby incorporated by reference in its entirety.

TECHNICAL FIELD

The present disclosure relates generally to the field of semiconductor technology, and more particularly, to an image sensor and a method for manufacturing an image sensor.

BACKGROUND

Crosstalk may be present between adjacent photodiodes in an image sensor.

Accordingly, there is a need for new technologies.

SUMMARY

One of aims of the present disclosure is to provide a new image sensor and a new method for manufacturing an image sensor.

One aspect of this disclosure is to provide an image sensor, comprising: a semiconductor substrate in which a photodiode is formed; a metal interconnection layer located above the semiconductor substrate; and an absorption layer located between the semiconductor substrate and the metal interconnection layer, wherein the absorption layer is configured to absorb light travelling through the semiconductor substrate.

Another aspect of this disclosure is to provide a method for manufacturing an image sensor, the method comprising: forming an absorption layer above a semiconductor substrate, wherein a photodiode is formed in the semiconductor substrate; and forming a metal interconnection layer above the absorption layer, wherein the absorption layer is configured to absorb light travelling through the semiconductor substrate.

Further features of the present disclosure and advantages thereof will become apparent from the following detailed description of exemplary embodiments with reference to the attached drawings.

BRIEF DESCRIPTION OF THE DRAWINGS

The accompanying drawings, which constitute a part of the specification, illustrate embodiments of the present disclosure and, together with the description, serve to explain the principles of the present disclosure.

The present disclosure will be better understood according the following detailed description with reference of the accompanying drawings.

Figure 1:
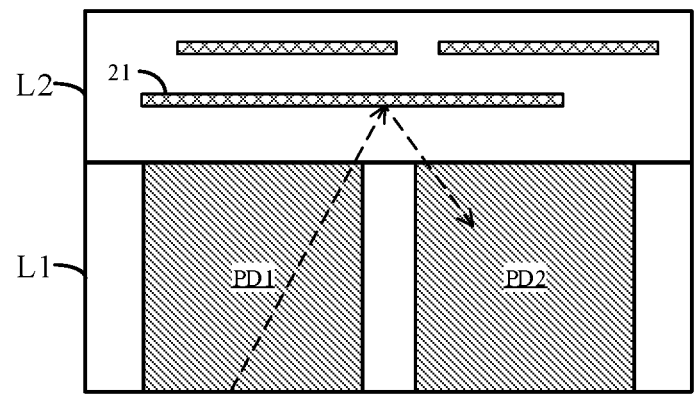
FIG. 1 schematically illustrates a configuration of an image sensor.

Note that, in the embodiments described below, in some cases the same portions or portions having similar functions are denoted by the same reference numerals in different drawings, and description of such portions is not repeated. In some cases, similar reference numerals and letters are used to refer to similar items, and thus once an item is defined in one figure, it need not be further discussed for following figures.

In order to facilitate understanding, the position, the size, the range, or the like of each structure illustrated in the accompanying drawings and the like are not accurately represented in some cases. Thus, the disclosure is not necessarily limited to the position, size, range, or the like as disclosed in the accompanying drawings and the like.

DETAILED DESCRIPTION

Various exemplary embodiments of the present disclosure will be described in details with reference to the accompanying drawings in the following. It should be noted that the relative arrangement of the components and steps, the numerical expressions, and numerical values set forth in these embodiments do not limit the scope of the present disclosure unless it is specifically stated otherwise.

The following description of at least one exemplary embodiment is merely illustrative in nature and is in no way intended to limit this disclosure, its application, or uses. That is to say, the structure and method discussed herein are illustrated by way of example to explain different embodiments according to the present disclosure. It should be understood by those skilled in the art that, these examples, while indicating the implementations of the present disclosure, are given by way of illustration only, but not in an exhaustive way. In addition, the accompanying drawings are not necessarily drawn to scale, and some features may be enlarged to show details of some specific components.

Techniques, methods and apparatus as known by one of ordinary skill in the relevant art may not be discussed in detail, but are intended to be regarded as a part of the specification where appropriate.

In all of the examples as illustrated and discussed herein, any specific values should be interpreted to be illustrative only and non-limiting. Thus, other examples of the exemplary embodiments could have different values.

FIG. 1 schematically illustrates a configuration of an image sensor. In the image sensor, a metal interconnection layer L2 is formed above a semiconductor substrate L1, and a photodiode is formed in the semiconductor substrate L1. The inventor of the present disclosure, after studying the image sensor, discovered that light incident from below may not be completely absorbed by the photodiode, so that some of the light, light with longer wavelengths for example, continues to travel upwards to reach the metal interconnection layer L2, as shown by a broken line with an arrow in FIG. 1. The inventor of the present disclosure also discovered that the light reaching the metal interconnection layer L2 may be reflected, by a metal 21 in the metal interconnection layer L2, back into the semiconductor substrate L1. For example, as shown by a broken line with an arrow in FIG. 1, light that travels through the photodiode PD1 but is not absorbed by the photodiode PD1, continues to travel upwards to reach the metal interconnection layer L2 and is reflected by the metal 21 in the metal interconnection layer L2 back into the semiconductor substrate L1. The light may enter an adjacent photodiode PD2 to cause crosstalk between the photodiodes.

Those skilled in the art may appreciate that direction words (for example, "below", "upwards", etc.) used in the specification of the present disclosure all refer to the directions when seen from the angle of view of the accompanying drawings. For example, the direction words in the descriptions that light incident from below and travelling upwards in the above, refer to directions when seen from the angle of view of FIG. 1 irrespective of directions when the image sensor is manufactured or used.

Those skilled in the art may appreciate that the accompanying drawings of the present disclosure emphasize more relevant parts and/or weaken, even omit, less relevant parts, in order to avoid unnecessarily obscuring the concept of the present disclosure. For example, only two photodiodes PD1, PD2 are shown in the semiconductor substrate L1 in FIGS. 1 and 2, but more photodiodes may obviously be formed in the semiconductor substrate L1. For another example, neighboring layers or portions shown in the accompanying drawings do not limit that the layers or portions are directly in contact with each other in the image sensor, and the neighboring layers or portions may be interposed by one or more other layers and/or portions. The accompanying drawings of the present schematically show the structures and/or positions of these layers and portions.

In accordance with some exemplary embodiments of the present disclosure, an image sensor is provided.

Figure 2:
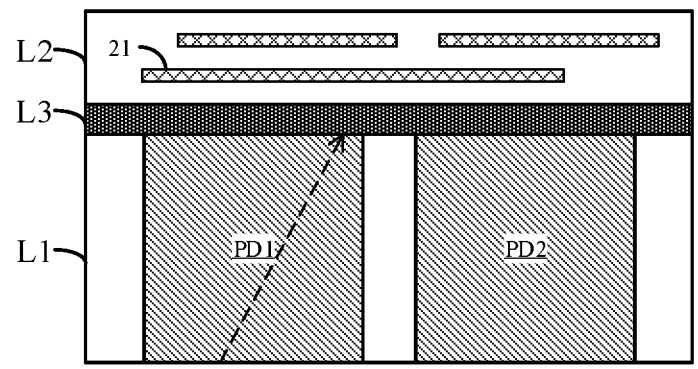
FIG. 2 schematically illustrates a configuration of an image sensor according to one or more exemplary embodiments of this disclosure.

In some embodiments, as shown in FIG. 2, an image sensor of the present disclosure comprises a semiconductor substrate L1, a metal interconnection layer L2 located above the semiconductor substrate L1, and an absorption layer L3 located between the semiconductor substrate L1 and the metal interconnection layer L2. Some photodiodes, for example photodiodes PD1, PD2, are formed in the semiconductor substrate L1. The absorption layer L3 is configured to absorb light travelling through the semiconductor substrate L1. Thus, as shown in FIG. 2, if light incident from the lower side of the image sensor is not completely absorbed by the photodiode PD1, it may be absorbed by the absorption layer L3 after travelling through the semiconductor substrate L1 and may not continue to travel to reach the metal interconnection layer L2. Moreover, the light may not be reflected by a metal 21 in the metal interconnection layer L2 back into the adjacent photodiode PD2 to cause crosstalk.

The absorption layer L3 is configured to absorb the light travelling through the semiconductor substrate L1 means that the absorption layer L3 is formed of a material capable of absorbing light. These materials may convert all or part of energy of light entering the material into energy in other forms, such as thermal energy, electrical energy, and so on. In some embodiments, the absorption layer L3 is formed of a semiconductor material, which may be the same as or different from a semiconductor material that the semiconductor substrate L1 formed of.

In some embodiments, an energy bandgap of the semiconductor material forming the absorption layer L3 may be smaller than an energy bandgap of a semiconductor material forming the semiconductor substrate L1. In comparison with a semiconductor material with a larger energy bandgap, an electron in a semiconductor material with a smaller energy bandgap may be excited from a valence band to a conduction band with less energy. That is, the electron in the semiconductor material with the smaller energy bandgap may be excited more easily, so light entering the semiconductor material with the smaller energy bandgap may be absorbed more easily. Accordingly, in comparison with an absorption layer formed of a semiconductor material with a larger energy bandgap, the absorption layer L3 in some embodiments may achieve the same or higher light absorption rate with a smaller thickness.

In some embodiments, the semiconductor material forming the absorption layer L3 is silicon-germanium $Si_{1-x}Ge_x$ ($0 \leq x \leq 1$). A melting point of silicon-germanium will decrease as a mole percentage x of germanium increases. Therefore, when the mole percentage x of germanium increases to a certain degree, the silicon-germanium may not be suitable for integration. Therefore, preferably, the mole percentage x of germanium in silicon-germanium forming the absorption layer L3 may be less than or equal to 30%, and more preferably, less than or equal to 20%.

Figure 3:
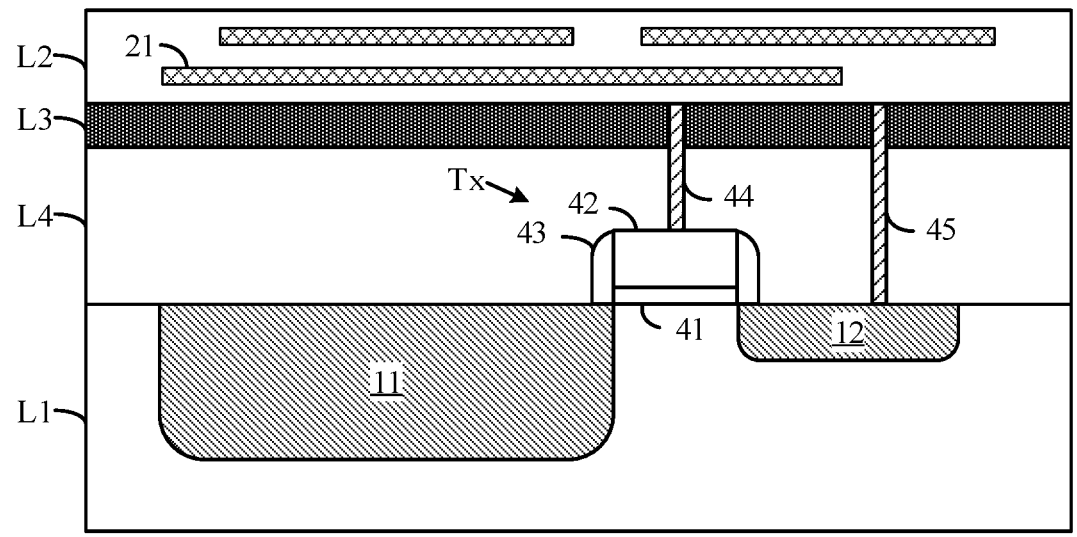
FIG. 3 schematically illustrates a configuration of an image sensor according to one or more exemplary embodiments of this disclosure.

In some embodiments, as shown in FIG. 3, an interlayer dielectric layer L4 is formed above the semiconductor substrate L1 and under the metal interconnection layer L2. In these cases, the absorption layer L3 is located between the interlayer dielectric layer L4 and the metal interconnection layer L2.

As shown in FIG. 3, a photodiode and a floating diffusion region 12 of a pixel unit are formed in the semiconductor substrate L1. The photodiode is formed by forming a region 11 of a second conductivity type in the semiconductor substrate L1 of a first conductivity type. The semiconductor substrate L1 is of the first conductivity type, and the region 11 for forming the photodiode and the floating diffusion region 12 are both of the second conductivity type. The first conductivity type may be P type and the second conductivity type may be N type, or the first conductivity type may be N type and the second conductivity type may be P type.

One or more gate structures of one or more transistors is formed in the interlayer dielectric layer L4, wherein the one or more transistors serve for the photodiode of the pixel unit. For example, in a 4T-type CMOS image sensor, one or more transistors may be one or more of a transfer transistor, a reset transistor, a source follower transistor, and a row selection transistor. A gate structure of a transistor Tx in the interlayer dielectric layer L4 shown in FIG. 3 is merely an illustrative example, one skilled in the art will appreciate that one or more gate structures of one or more other transistors may also be formed in the interlayer dielectric layer L4, and active regions of other transistors may also be formed in the semiconductor substrate L1 accordingly.

In the illustrative example shown in FIG. 3, a source region and a drain region of the transistor Tx may comprise the floating diffusion region 12 and the region 11 for forming the photodiode both formed in the semiconductor substrate L1. The gate structure of the transistor Tx formed in the interlayer dielectric layer L4 may be used to control the transfer of charges in the photodiode into the floating diffusion region 12. As shown in FIG. 3, the gate structure of the transistor Tx may include a gate dielectric 41, a gate electrode 42, and gate spacers 43. In addition, conductive contacts 24, 25 used for coupling to one or more external circuits are formed above the gate electrode 42 of the transistor Tx and above the floating diffusion region 12.

An absorption layer L3 is formed above the interlayer dielectric layer L4, and the metal interconnection layer L2 is formed above the absorption layer L3. The absorption layer L3 is configured to absorb light travelling through the semiconductor substrate L1. In some examples, the absorption layer L3 is formed of a semiconductor material, which may be the same as or different from a semiconductor material that the semiconductor substrate L1 formed of. In other examples, an energy bandgap of the semiconductor material forming the absorption layer L3 is smaller than an energy bandgap of a semiconductor material forming the semiconductor substrate L1. For example, the semiconductor material forming the semiconductor substrate L1 is silicon, and the semiconductor material forming the absorption layer L3 is silicon-germanium.

In these embodiments, light incident from the lower side of the image sensor travelling through the semiconductor substrate L1, continues to travel upwards through the interlayer dielectric layer L4 and reach the absorption layer L3, if the light is not completely absorbed by the semiconductor substrate L1. The light then is absorbed by the absorption layer L3 so that it may not continue to travel to the metal interconnection layer L2 and be reflected by the metal 21 into adjacent photodiodes to cause crosstalk.

In these embodiments, since the conductive contacts 24, 25 are expected to be coupled to one or more external circuits via the metal 21 in the metal interconnection layer L2, the conductive contacts 24, 25 pass through both a dielectric material in the interlayer dielectric layer L4 and the absorption layer L3 in order to be coupled to the metal 21 in the metal interconnection layer L2.

In these embodiments, a material for forming the gate electrode 42 of the transistor Tx is not limited, which may be any electrically conductive material, for example a doped semiconductor material and the like. The doped semiconductor material may be the same as or different from a semiconductor material that the semiconductor substrate L1 formed of. In the case where the absorption layer L3 is formed of a semiconductor material, the doped semiconductor material may be the same as or different from the semiconductor material that the absorption layer L3 formed of.

Figure 4:
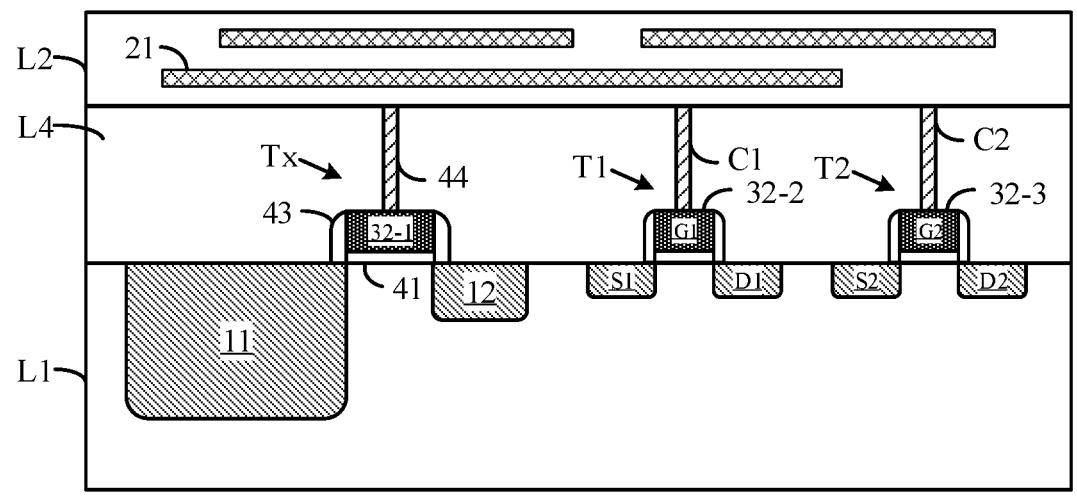
FIG. 4 schematically illustrates a configuration of an image sensor according to one or more exemplary embodiments of this disclosure.

In some embodiments, as shown in FIG. 4, an absorption layer L3 and an interlayer dielectric layer L4 is formed above the semiconductor substrate L1 and under the metal interconnection layer L2. The absorption layer L3 comprises gate electrodes 32-1, 32-2, 32-3 in gate structures of transistors Tx, T1, T2 located in the interlayer dielectric layer L4. The transistors Tx, T1, T2 serve for a photodiode in a pixel unit.

As shown in FIG. 4, a photodiode and a floating diffusion region 12 of a pixel unit are formed in the semiconductor substrate L1. The photodiode is formed by forming a region 11 of a second conductivity type in the semiconductor substrate L1 of a first conductivity type. A source region and a drain region of the transistor Tx may comprise the floating diffusion region 12 and the region 11 for forming the photodiode both formed in the semiconductor substrate L1. A source region S1 and a drain region D1 of the transistor T1, and a source region S2 and a drain region D2 of the transistor T2 are also formed in the semiconductor substrate L1. Although gate structures of the three transistors Tx, T1, T2 are shown in the interlayer dielectric layer L4 in the illustrative example shown in FIG. 4, those skilled in the art may appreciate that there may be fewer or more transistors in the interlayer dielectric layer L4, and there may even be one or more other structures of the image sensor.

The gate structures of the transistors Tx, T1, T2 are formed in the interlayer dielectric layer L4. The gate structure of the transistor Tx may comprise a gate dielectric 41, a gate electrode 32-1, and gate spacers 43. Although some portions, except gate electrodes 32-2, 32-3, in gate structures G1, G2 of the transistors T1, T2, are not denoted by reference numerals, those skilled in the art may learn the complete configuration of gate structures G1, G2.

Conductive contacts 44, C1, C2 used for the transistors Tx, T1, T2 are also formed in the interlayer dielectric layer L4. Those conductive contacts 44, C1, C2 are coupled to one or more external circuits via the metal 21 in the metal interconnection layer L2. Those skilled in the art may appreciate that the transistors Tx, T1, T2 obviously may further comprise other conductive contacts in addition to conductive contacts 44, C1, C2 used for gate electrodes 32-1, 32-2, 32-3 of the transistors Tx, T1, T2, although not illustrated in FIG. 4 for purposes of clarity.

In these embodiments, the absorption layer L3 comprise the gate electrodes 32-1, 32-2, 32-3 in the gate structures of the transistors formed in the interlayer dielectric layer L4. The gate electrodes 32-1, 32-2, 32-3 are formed of a semiconductor material capable of absorbing light, and the semiconductor material forming the gate electrodes 32-1, 32-2, 32-3 has a smaller energy bandgap than the semiconductor material forming the semiconductor substrate L1. For example, the semiconductor material forming the semiconductor substrate L1 is silicon, and the semiconductor material forming the absorption layer L3 is silicon-germanium.

In these embodiments, light incident from the lower side of the image sensor, if not completely absorbed by the semiconductor substrate L1 after travelling through the semiconductor substrate L1, continues to travel upwards. When reaching the absorption layer L3, e.g., gate electrodes 32-1, 32-2, 32-3, the light may be absorbed by the absorption layer L3. Thus, at least a part of the light may not continue to travel to the metal interconnection layer L2 and be reflected by the metal 21 into adjacent photodiodes to cause crosstalk.

In these embodiments, the energy bandgap of the semiconductor material forming the gate electrodes 32-1, 32-2, 32-3 of the transistors Tx, T1, T2 is smaller than the energy bandgap of the semiconductor material forming the semiconductor substrate L1. For example, the gate electrodes 32-1, 32-2, 32-3 may be formed of doped silicon-germanium. A conductivity type of the doped ion impurities in the gate electrodes 32-1, 32-2, 32-3 may be the second conductivity type which is the same as the conductivity type of the region 11. A doping concentration of the doped ion impurities in the gate electrodes 32-1, 32-2, 32-3 may be ranged from $1.0 \times 10^{20}$ cm$^{-3}$ to $1.0 \times 10^{21}$ cm$^{-3}$.

Incidentally, although some of the accompanying drawings illustrate three transistors while some others illustrate one transistor in a unit pixel, those skilled in the art may appreciate that this is only for simplicity and clarity, not intended to limit that any of the embodiments of the present disclosure is only applicable in the case of comprising three transistors or one transistor in a unit pixel. Indeed, any of the embodiments of the present disclosure described are applicable to any of the cases described in the present disclosure, illustrated in the accompanying drawings, and obtained according to the present disclosure and various modifications and deformations thereof by those skilled in the art.

Figure 5:
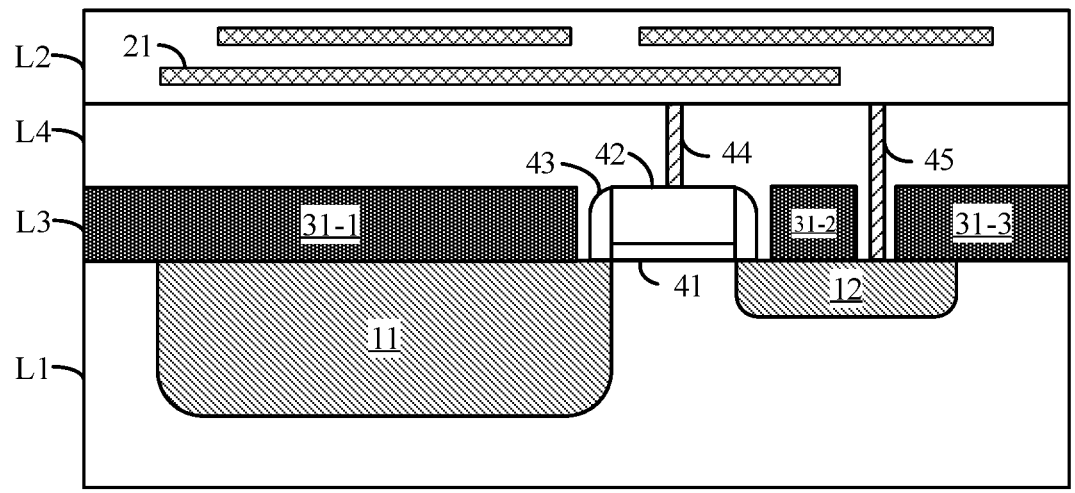
FIG. 5 schematically illustrates a configuration of an image sensor according to one or more exemplary embodiments of this disclosure.
Figure 6:
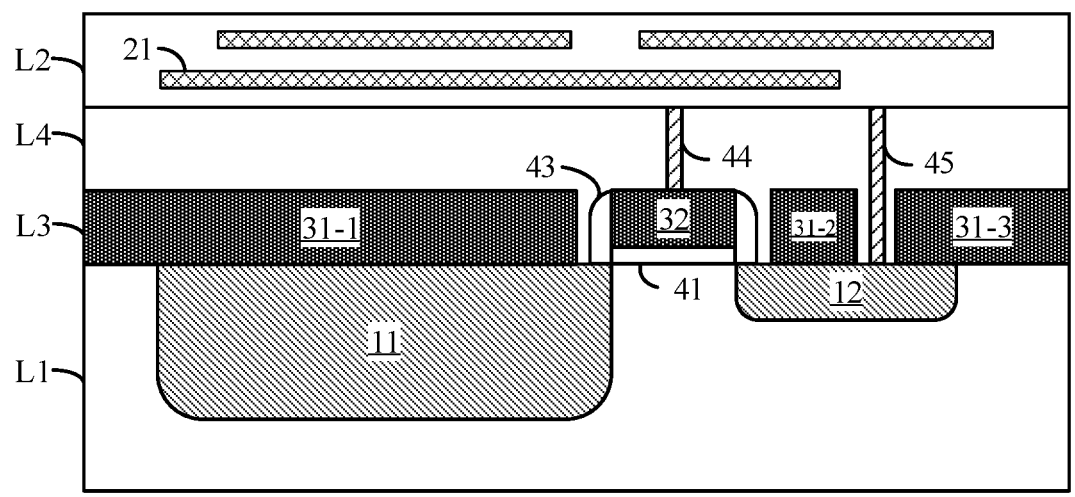
FIG. 6 schematically illustrates a configuration of an image sensor according to one or more exemplary embodiments of this disclosure.

In some embodiments, as shown in FIGS. 5 and 6, the absorption layer L3 covers the upper surface of the semiconductor substrate L1. Those skilled in the art may appreciate that the absorption layer L3 may covers the upper surface of the semiconductor substrate L1 substantially entirely or in part, and in direct contact or in non-direct contact. As shown in FIGS. 5 and 6, the absorption layer L3 comprises covering portions 31-1, 31-2, 31-3 (collectively referred to as covering portions 31 hereinafter) covering the upper surface of the semiconductor substrate L1. The covering portions 31 are spaced apart from both the gate structures of the transistors and conductive contacts serving for the transistors. In the illustrative example shown in FIG. 6, the absorption layer L3 also comprises the gate electrode 32 in the gate structure of the transistor.

In these embodiments, light incident to the image sensor, after travelling through the semiconductor substrate L1, is absorbed by the absorption layer L3 without travelling through the interlayer dielectric layer L4. In comparison with the illustrative example shown in FIG. 3, since the light does not travel through the interlayer dielectric layer L4 before being absorbed, additional scattering, reflection and the like are avoided without increasing the height of conductive contacts. In comparison with the illustrative example shown in FIG. 4, the covering portion 31 of the absorption layer L3 covers the upper surface of the semiconductor substrate L1 without forming gate structures and conductive contacts, and total area of the absorption layer L3 increases.

Although the covering portion 31 of the absorption layer L3 shown in FIGS. 5 and 6 partially covers the upper surface of the semiconductor substrate L1, those skilled in the art may appreciate that the covering portion 31 of the absorption layer L3 may completely cover the upper surface of the semiconductor substrate L1 according to the present disclosure. For example, since the absorption layer L3 is also formed of a semiconductor material, a layer of semiconductor material suitable for the absorption layer L3 may be formed (for example, by a deposition process or an epitaxial growth process) on the upper surface of the semiconductor substrate L1 so as to form the covering portion 31 of the absorption layer L3 completely covering on the upper surface of the substrate L1. After that, the semiconductor substrate L1 and the covering portion 31 of the absorption layer L3 completely covering thereon may be treated together as a new semiconductor substrate to form other structures of the image sensor.

Although the covering portions 31-1, 31-2, 31-3 of the absorption layer L3 shown in FIGS. 5 and 6 are in direct contact with the upper surface of the semiconductor substrate L1, those skilled in the art may appreciate that there may be one or more other structures between the covering portions 31-1, 31-2, 31-3 of the absorption layer L3 and the upper surface of the semiconductor substrate L1. The other structures are not shown in order to avoid unnecessarily obscuring the concept of the present disclosure.

In accordance with some exemplary embodiments of the present disclosure, a method for manufacturing an image sensor is provided.

In some embodiments, a method of the present disclosure for manufacturing an image sensor comprising: forming an absorption layer L3 above a semiconductor substrate L1, wherein a photodiode is formed in the semiconductor substrate L1; and forming a metal interconnection layer L2 above the absorption layer L3, wherein the absorption layer L3 is configured to absorb light travelling through the semiconductor substrate. Thus, an image sensor such as shown in FIG. 2 is formed. In some embodiments, the absorption layer L3 is formed of a semiconductor material, and preferably, an energy bandgap of the semiconductor material forming the absorption layer is smaller than an energy bandgap of a semiconductor material forming the semiconductor substrate. In some embodiments, the semiconductor material forming the absorption layer is silicon-germanium, and preferably, a mole percentage of germanium in silicon-germanium is less than or equal to 30%, and more preferably, less than or equal to 20%.

A method for manufacturing an image sensor according to some exemplary embodiments of this disclosure are described below with reference to FIGS. 7A to 7F and FIG. 8.

Figure 7A:
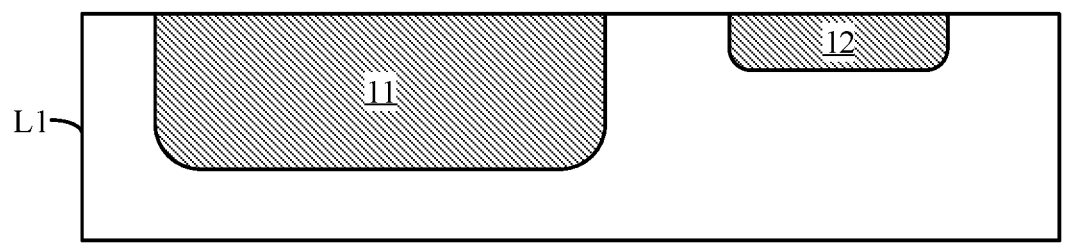
FIGS. 7A to 7F schematically illustrate respectively a method for manufacturing an image sensor according to one or more exemplary embodiments of this disclosure, in fragmentary cross sections of the image sensor at one or more steps.
Figure 8:
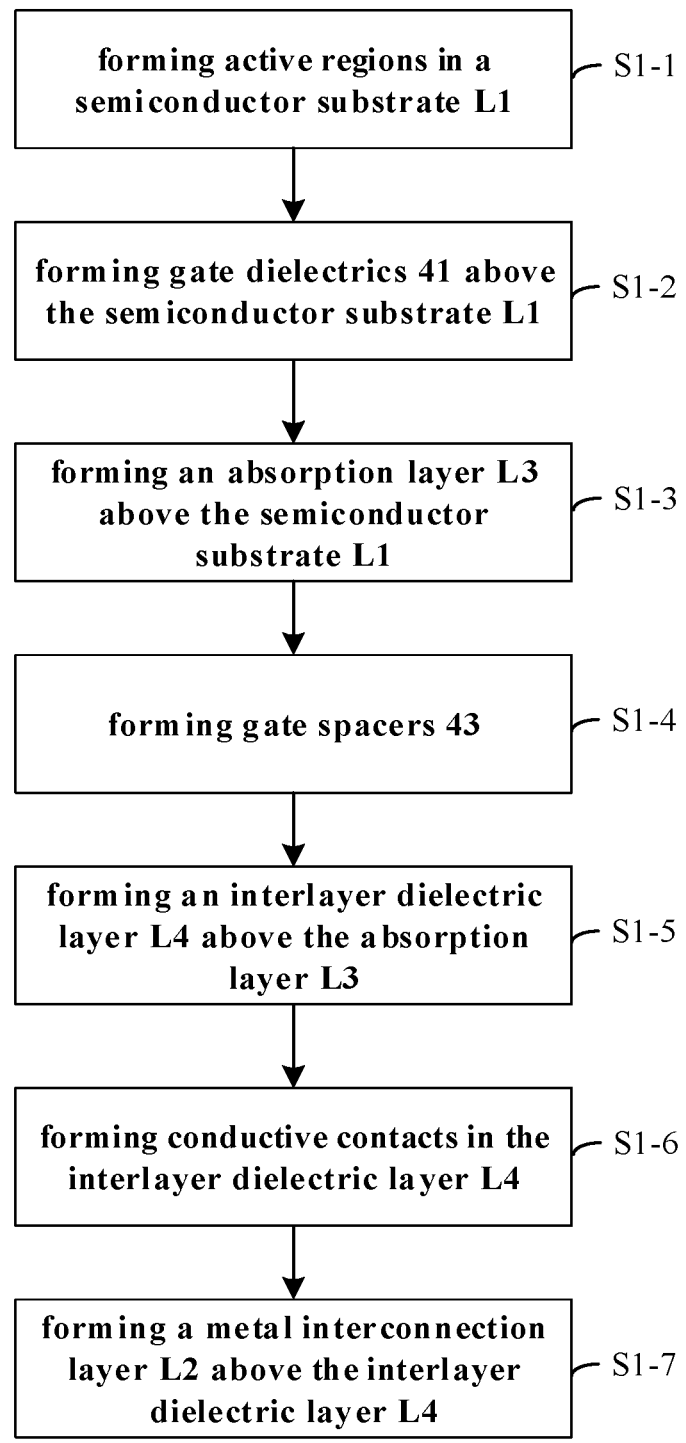
FIG. 8 schematically illustrates a flow of a method for manufacturing an image sensor according to one or more exemplary embodiments of this disclosure.

In some embodiments, as shown in FIG. 8, the method for manufacturing an image sensor according to some exemplary embodiments of this disclosure comprises the following steps:

Step S1-1: forming active regions of each transistor in a semiconductor substrate L1, as shown in FIG. 7A. The active regions of each transistor comprise a region 11 for forming a photodiode, a floating diffusion region 12, source regions and drain regions of other transistors not shown, a channel region of each transistor, and the like. Forming active regions of each transistor may be performed by an ion implantation process.

Figure 7B:
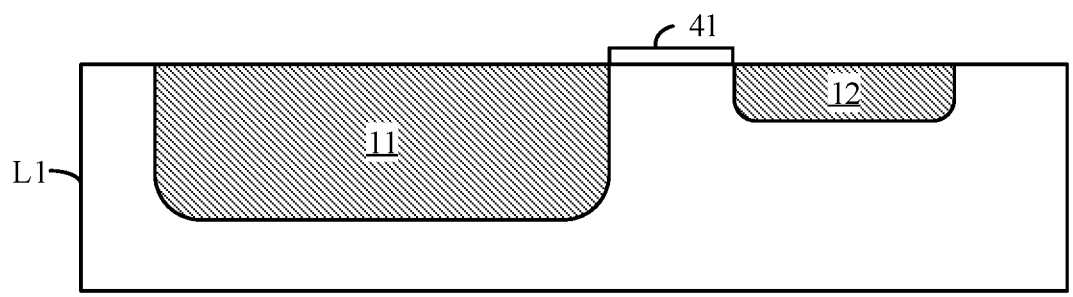

Step S1-2: forming a gate dielectric 41 above the semiconductor substrate L1 as shown in FIG. 7B. The gate dielectric 41 may be formed of a dielectric material such as silicon oxide. For example, the gate dielectric 41 may be formed by depositing a layer of dielectric material above the semiconductor substrate L1 and then forming the gate dielectric 41 in patterning process (e.g., photolithography and etching process).

Figure 7C:
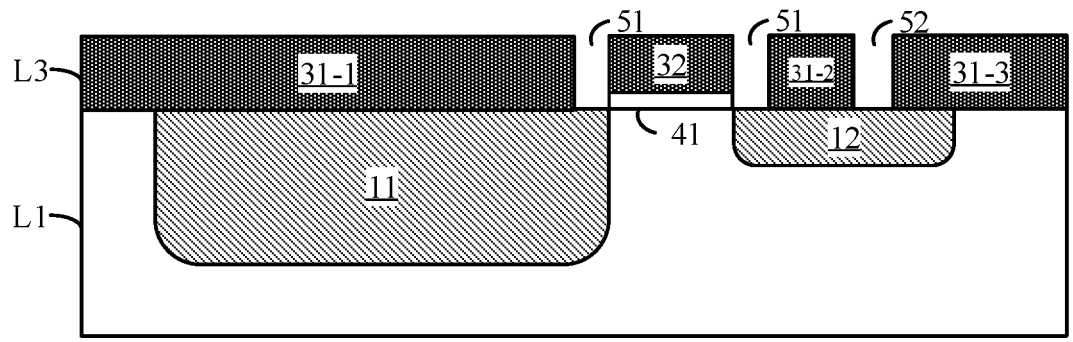

Step S1-3: An absorption layer L3 is formed above the semiconductor substrate L1, as shown in FIG. 7C. In an illustrative example shown in FIG. 7C, the absorption layer L3 formed comprises covering portions 31-1, 31-2, 31-3 and a gate electrode 32 of a transistor. The gate electrode 32 of the transistor is formed above the gate dielectric 41, and the covering portions 31-1, 31-2, 31-3 are formed above the upper surface of the semiconductor substrate L1 and spaced apart, by groove 51 shown in FIG. 7C for example, from gate structures of the transistor to be formed. In addition, the covering portions 31-1, 31-2, 31-3 are further spaced apart, by groove 52 shown in FIG. 7C for example, from conductive contacts serving for the transistors to be formed. In this step, forming the absorption layer L3 may be performed by a deposition process, for example depositing a semiconductor material with a smaller bandgap (for example, silicon-germanium) suitable for the absorption layer L3, and then forming the covering portions 31-1, 31-2, 31-3 and the gate electrode 32 may be performed by a planarization process (e.g., chemical mechanical planarization process) and a patterning process (e.g., photolithography and etching process). The covering portions 31-1, 31-2, 31-3 are spaced apart from both the gate electrode 32 and conductive contacts serving for the transistors.

Figure 7D:
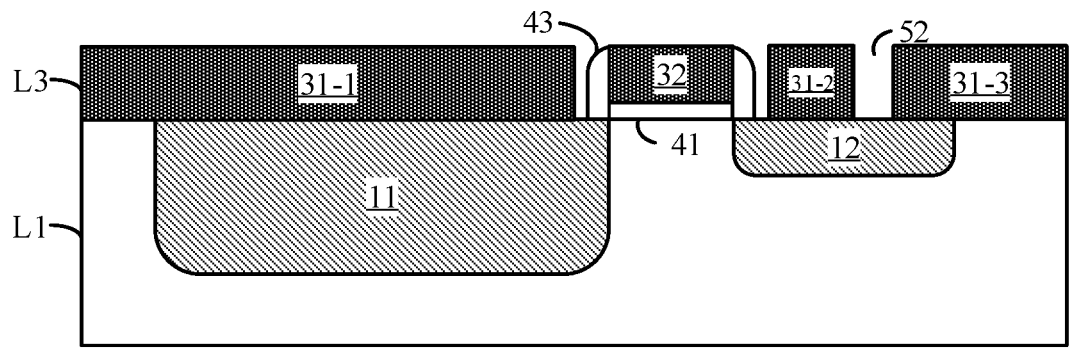

Step S1-4: forming gate spacers 43, as shown in FIG. 7D. Gate spacers 43 are formed in the groove 51 formed in the Step S1-3. For example, the gate spacers 43 may be formed by depositing a dielectric material and performing an ion etching-back process.

Figure 7E:
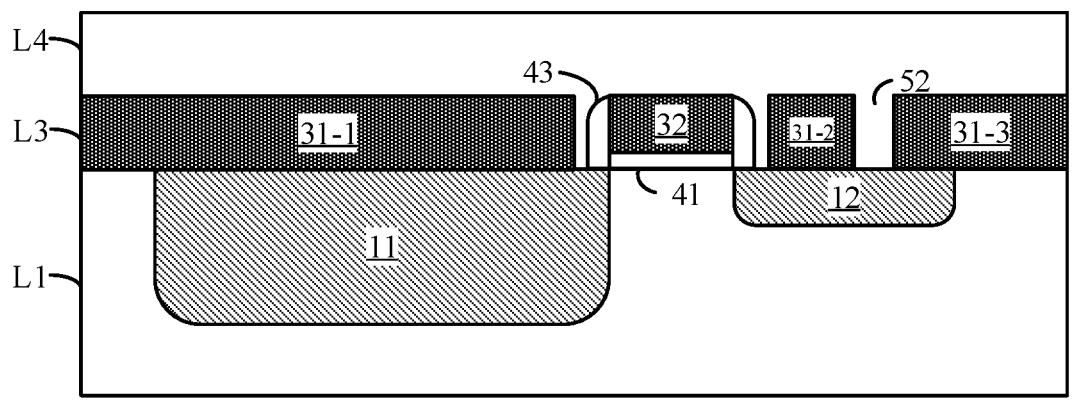

Step S1-5: forming an interlayer dielectric layer L4 above the absorption layer L3, as shown in FIG. 7E. The interlayer dielectric layer L4 is formed, for example, by a process of depositing a dielectric material and a planarization process (for example, a chemical mechanical planarization process). As shown in FIG. 7E, a dielectric material is filled in a gap between the gate spacers 43 and the covering portion 31, and in the groove 52 formed in step S1-3 used for conductive contacts to be formed for the transistor.

Figure 7F:
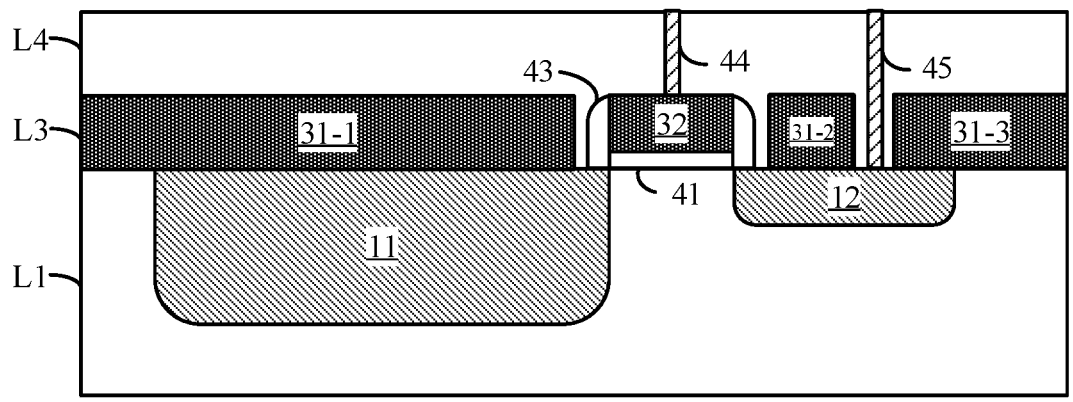

Step S1-6: forming conductive contacts 44, 45 in the interlayer dielectric layer L4, as shown in FIG. 7F. Forming the conductive contacts 44, 45 may be performed by first forming a contacting via extending through the interlayer dielectric layer L4 and then filling the contacting via with a conductive material. The formed conductive contacts 44, 45 extend downward from the upper surface of the interlayer dielectric layer L4 and reach the gate electrode 32 of the transistor or the active regions of the transistor so that the filled conductive material may be coupled with the gate electrode 32 or the active regions. The conductive contact 45 for the active regions of the transistor may be formed in the groove 52 and not in contact with the covering portion 31.

Step S1-7: forming a metal interconnection layer L2 above the interlayer dielectric layer L4, so as to form an image sensor as shown in FIG. 6. The conductive contacts 44, 45 formed in Step S1-6 may thus be coupled to one or more external circuits through the metal 21 in the metal interconnection layer L2.

In the steps of these embodiments above, after forming the gate electrode 32, i.e., after Step S1-3, and before forming the interlayer dielectric layer L4, i.e., prior to Step S1-5, the gate electrode 32 may be doped, by ion implantation for example. For example, an implantation dose may be ranged from $1.0 \times 10^{15}$ $cm^{-2}$ to $3.0 \times 10^{15}$ $cm^{-2}$, so that a doping concentration of the doped ion impurities in the gate electrode 32 may be ranged from $1.0 \times 10^{20}$ $cm^{-3}$ to $1.0 \times 10^{21}$ $cm^{-3}$.

A method for manufacturing an image sensor according to some exemplary embodiments of this disclosure are described below with reference to FIGS. 9A, 9B, 7C to 7F and FIG. 10.

Figure 9A:
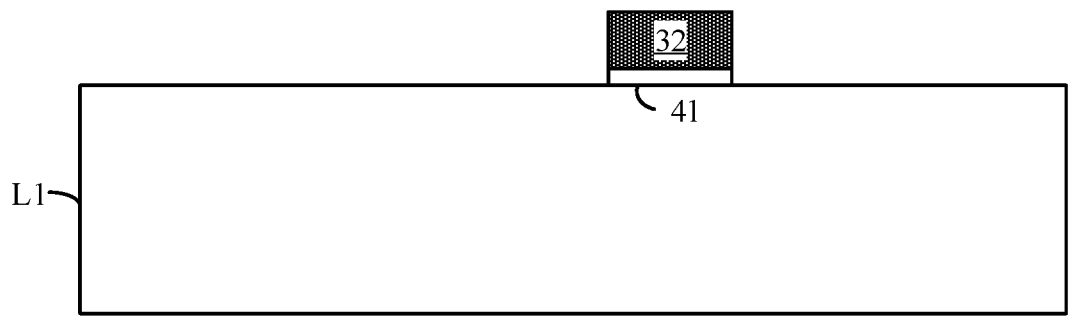
FIGS. 9A and 9B schematically illustrate respectively a method for manufacturing an image sensor according to one or more exemplary embodiments of this disclosure, in fragmentary cross sections of the image sensor at one or more steps.
Figure 10:
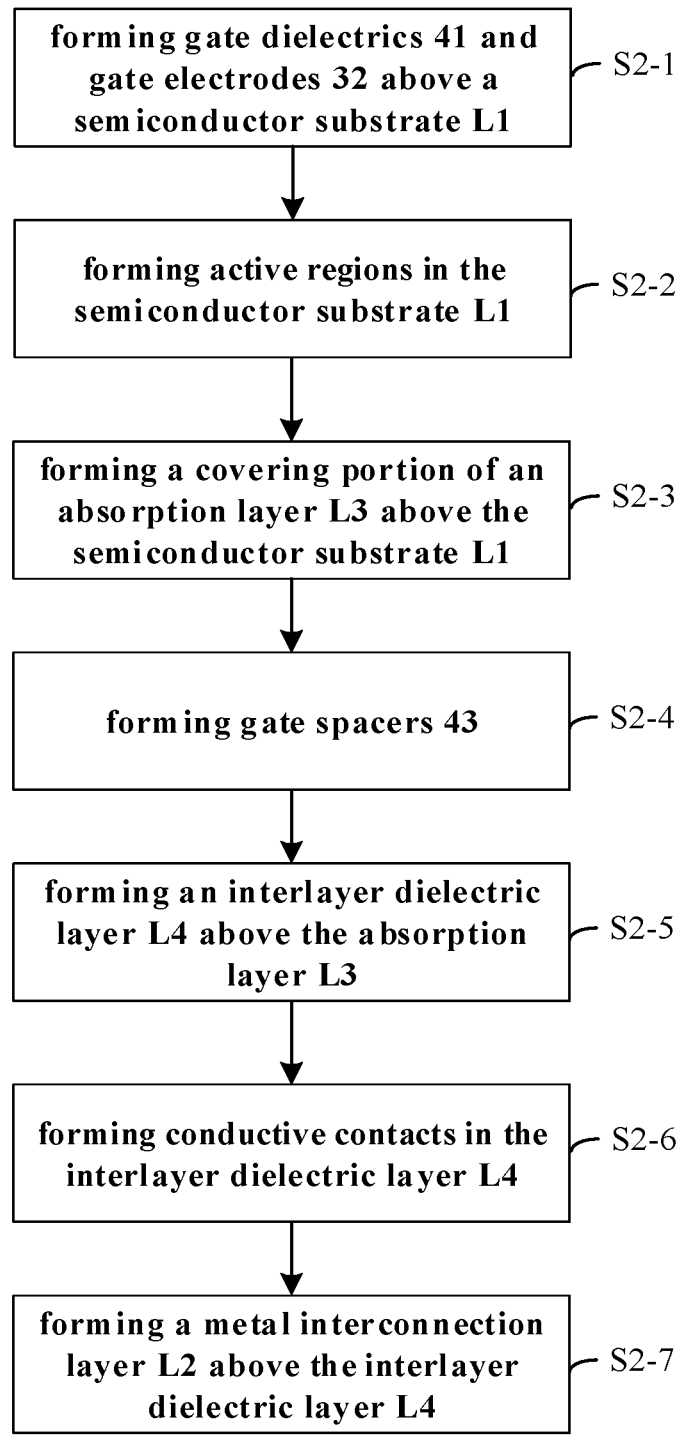
FIG. 10 schematically illustrates a flow of a method for manufacturing an image sensor according to one or more exemplary embodiments of this disclosure.

In some embodiments, as shown in FIG. 10, the method for manufacturing an image sensor according to some exemplary embodiments of this disclosure comprises the following steps:

Step S2-1: forming a gate dielectric 41 and a gate electrode 32 of a transistor above the semiconductor substrate L1, as shown in FIG. 9A. The gate dielectric 41 may be formed of a dielectric material such as silicon oxide. For example, a layer of dielectric material may be formed above the semiconductor substrate L1 by a deposition process, and then the gate dielectric 41 may be formed through a patterning process such as photolithography and etching process. The gate electrode 32 is formed of a material capable of absorbing light (i.e., a material suitable for the absorption layer L3). The gate electrode 32 may be formed by a deposition process such as depositing a semiconductor material with a smaller energy bandgap (e.g., silicon-germanium) suitable for the absorption layer L3, then a planarization process (e.g., chemical mechanical planarization process) and a patterning process (e.g., photolithography and etching process). Thus, the gate electrode 32 is located above the gate dielectric 41.

Figure 9B:
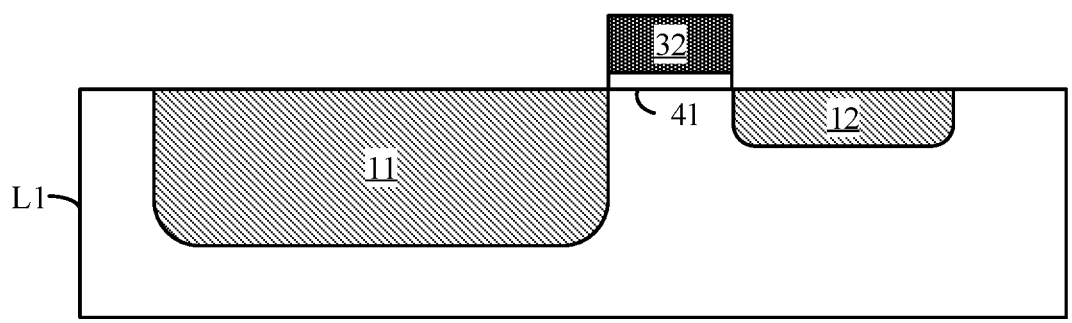

Step S2-2: forming active regions of each transistor in the semiconductor substrate L1 as shown in FIG. 9B. The active regions of each transistor comprise a region 11 for forming a photodiode, a floating diffusion region 12, one or more source regions and one or more drain regions of one or more other transistors not shown, and a channel region of each transistor and the like. The formation of the active regions of each transistor may be performed by an ion implantation process. Since the gate dielectric 41 and the gate electrode 32 have been formed above the semiconductor substrate L1, ion implantation for the active regions of each transistor may apply a self-aligning process, in which the ion implantation of the gate electrode 32 may be performed during the ion implantation process for the active regions. That is, the doping of the gate electrode 32 is performed while the active regions is formed. For example, an implantation dose may be ranged from $1.0 \times 10^{15}$ $cm^{-2}$ to $3.0 \times 10^{15}$ $cm^{-2}$.

Step S2-3: forming covering portion 31-1, 31-2, 31-3 of the absorption layer L3 above the semiconductor substrate L1, as shown in FIG. 7C. The absorption layer L3 formed so far comprises the gate electrode 32 of the transistor and the covering portions 31-1, 31-2, 31-3. The covering portions 31-1, 31-2, 31-3 are formed above the upper surface of the semiconductor substrate L1, and spaced apart from the gate electrode 32 of the transistor, for example, by grooves 51 as shown in FIG. 7C. In addition, the covering portions 31-1, 31-2, 31-3 are also spaced apart from conductive contacts to be formed used for the transistor, for example, by a groove 52 as shown in FIG. 7C. In this step, the formation of the covering portions 31-1, 31-2, 31-3 may be performed by a deposition process such as depositing a semiconductor material having a smaller bandgap (for example, silicon-germanium) suitable for the absorption layer L3, and then by a planarization process (for example, a chemical mechanical planarization process) and a patterning process (for example, photolithography and etching processes), wherein the covering portions 31-1, 31-2, 31-3 are spaced apart from the gate electrode 32 and one or more conductive contacts for the transistor.

Step S2-4: forming gate spacers 43, as shown in FIG. 7D. Gate spacers 43 are formed in the groove 51 formed in the Step S1-3. For example, the gate spacers 43 may be formed by depositing a dielectric material and performing an ion etching-back process.

Step S2-5: forming an interlayer dielectric layer L4 above the absorption layer L3, as shown in FIG. 7E. The interlayer dielectric layer L4 is formed, for example, by a process of depositing a dielectric material and a planarization process (for example, a chemical mechanical planarization process). As shown in FIG. 7E, a dielectric material is filled in a gap between the gate spacers 43 and the covering portion 31, and in the groove 52 formed in step S2-3 used for conductive contacts to be formed for the transistor.

Step S2-6: forming conductive contacts 44, 45 in the interlayer dielectric layer L4, as shown in FIG. 7F. Forming the conductive contacts 44, 45 may be performed by first forming a contacting via extending through the interlayer dielectric layer L4 and then filling the contacting via with a conductive material. The formed conductive contacts 44, 45 extend downward from the upper surface of the interlayer dielectric layer L4 and reach the gate electrode 32 of the transistor or the active regions of the transistor so that the filled conductive material may be coupled with the gate electrode 32 or the active regions. The conductive contact 45 for the active regions of the transistor may be formed in the groove 52 and not in contact with the covering portion 31.

Step S2-7: forming a metal interconnection layer L2 above the interlayer dielectric layer L4, so as to form an image sensor as shown in FIG. 6. The conductive contacts 44, 45 formed in Step S2-6 may thus be coupled to one or more external circuits through the metal 21 in the metal interconnection layer L2.

In the steps of these embodiments above, after forming the gate electrode 32, i.e., after Step S2-1, and before forming the interlayer dielectric layer L4, i.e., prior to Step S2-5, the gate electrode 32 may be doped, by ion implantation for example. For example, an implantation dose may be ranged from $1.0 \times 10^{15}$ cm$^{-2}$ to $3.0 \times 10^{15}$ cm$^{-2}$, so that a doping concentration of the doped ion impurities in the gate electrode 32 may be ranged from $1.0 \times 10^{20}$ cm$^{-3}$ to $1.0 \times 10^{21}$ cm$^{-3}$.

A method for manufacturing an image sensor according to some exemplary embodiments of this disclosure are described below with reference to FIGS. 11A, 11B, 7B to 7F and FIG. 12.

Figure 11A:
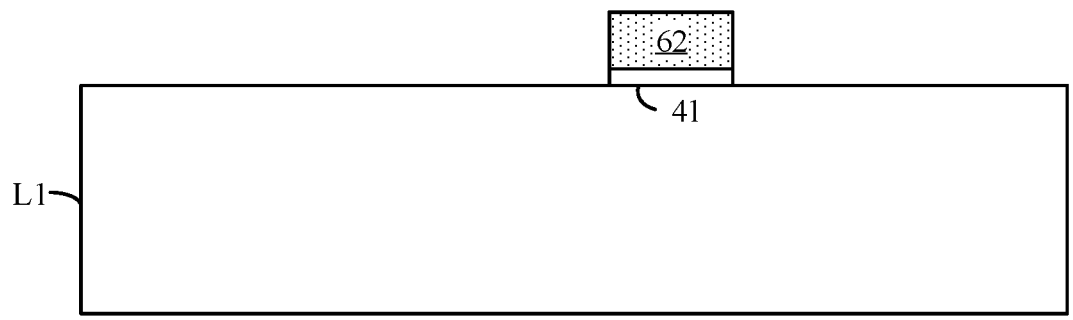
FIGS. 11A and 11B schematically illustrate respectively a method for manufacturing an image sensor according to one or more exemplary embodiments of this disclosure, in fragmentary cross sections of the image sensor at one or more steps.
Figure 12:
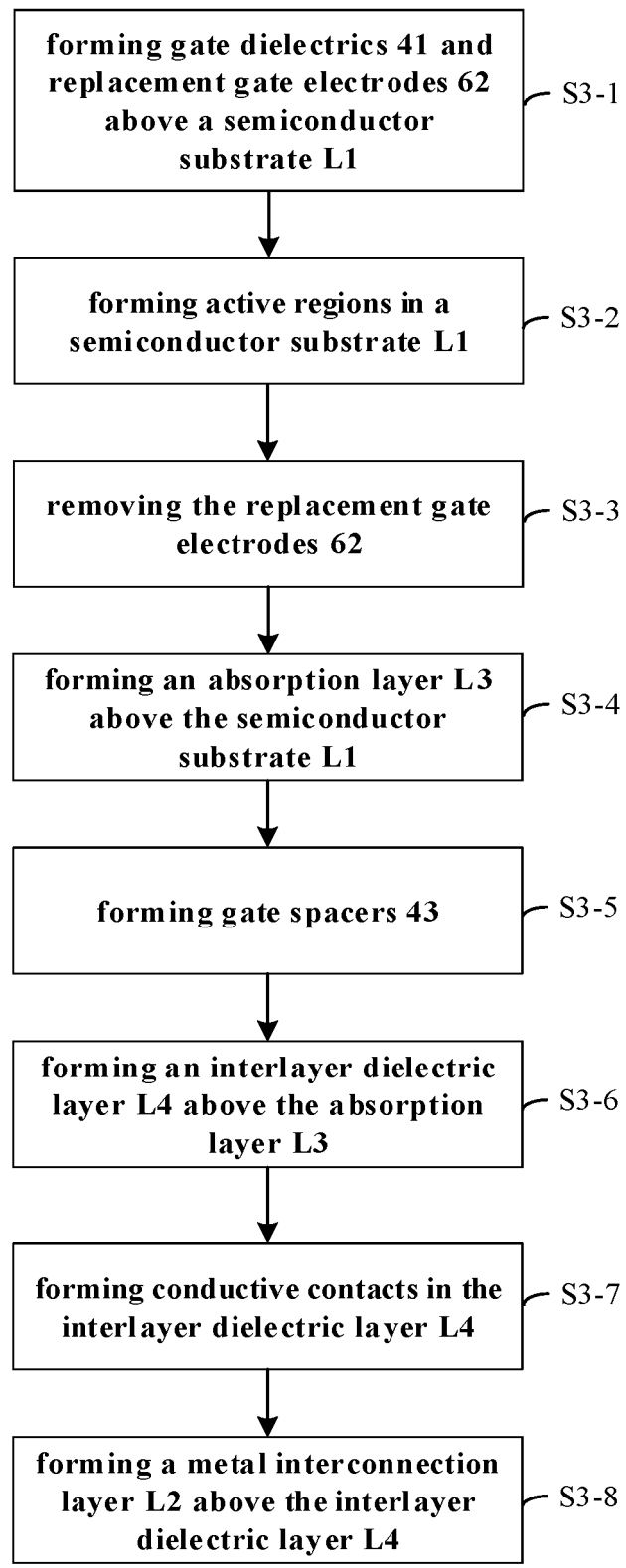
FIG. 12 schematically illustrates a flow of a method for manufacturing an image sensor according to one or more exemplary embodiments of this disclosure.

In some embodiments, as shown in FIG. 12, the method for manufacturing an image sensor according to some exemplary embodiments of this disclosure comprises the following steps:

Step S3-1: forming a gate dielectric 41 and a replacement gate electrode 62 of a transistor above the semiconductor substrate L1, as shown in FIG. 11A. The gate dielectric 41 may be formed of a dielectric material such as silicon oxide. For example, a layer of dielectric material may be formed above the semiconductor substrate L1 by a deposition process, and then the gate dielectric 41 may be formed through a patterning process such as photolithography and etching process. The present disclosure does not limit the material for forming the replacement gate electrode 62, and those skilled in the art may make a selection for the material forming the replacement gate electrode 62 according to the actual application environment under the teachings of the present disclosure. The gate electrode 62 may be formed by a deposition process and located above the gate dielectric 41.

Figure 11B:
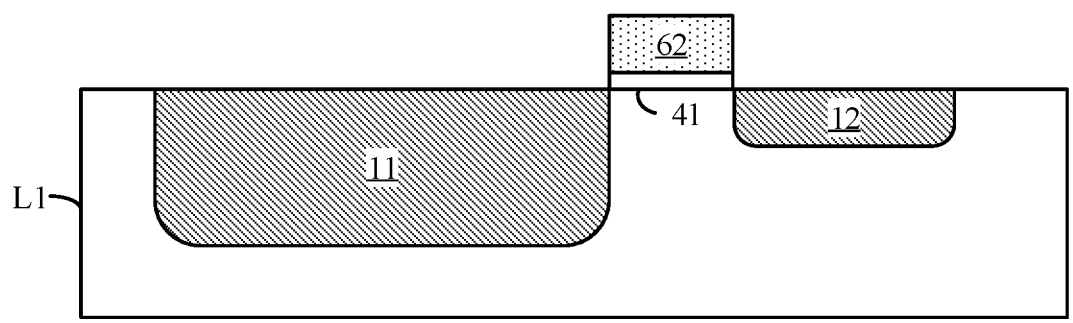

Step S3-2: forming active regions of each transistor in the semiconductor substrate L1 as shown in FIG. 11B. The active regions of each transistor comprise a region 11 for forming a photodiode, a floating diffusion region 12, one or more source regions and one or more drain regions of one or more other transistors not shown, and a channel region of each transistor and the like. The formation of the active regions of each transistor may be performed by an ion implantation process. Since the gate dielectric 41 and the replacement gate electrode 62 have been formed above the semiconductor substrate L1, ion implantation for the active regions of each transistor may apply a self-aligning process.

Step S3-3: Removing the replacement gate electrode 62 and the image sensor after the step of removing is shown in FIG. 7B. The present disclosure does not limit the process for removing the replacement gate electrode 62, and those skilled in the art may make a selection for the process of removing the replacement gate electrode 62 according to the actual application environment under the teachings of the present disclosure. For example, removing the replacement gate electrode 62 may be performed by dry etching process, wet etching process, chemical mechanical planarization process, or the like.

Step S3-4: An absorption layer L3 is formed above the semiconductor substrate L1, as shown in FIG. 7C. In an illustrative example shown in FIG. 7C, the absorption layer L3 formed comprises covering portions 31-1, 31-2, 31-3 and a gate electrode 32 of a transistor. The gate electrode 32 of the transistor is formed above the gate dielectric 41, and the covering portions 31-1, 31-2, 31-3 are formed above the upper surface of the semiconductor substrate L1 and spaced apart, by groove 51 shown in FIG. 7C for example, from gate structures of the transistor to be formed. In addition, the covering portions 31-1, 31-2, 31-3 are further spaced apart, by groove 52 shown in FIG. 7C for example, from conductive contacts serving for the transistors to be formed. In this step, forming the absorption layer L3 may be performed by a deposition process, for example depositing a semiconductor material with a smaller bandgap (for example, silicon-germanium) suitable for the absorption layer L3, and then forming the covering portions 31-1, 31-2, 31-3 and the gate electrode 32 may be performed by a planarization process (e.g., chemical mechanical planarization process) and a patterning process (e.g., photolithography and etching process). The covering portions 31-1, 31-2, 31-3 are spaced apart from both the gate electrode 32 and conductive contacts serving for the transistors.

Step S3-5: forming gate spacers 43, as shown in FIG. 7D. Gate spacers 43 are formed in the groove 51 formed in the Step S3-3. For example, the gate spacers 43 may be formed by depositing a dielectric material and performing an ion etching-back process.

Step S3-6: forming an interlayer dielectric layer L4 above the absorption layer L3, as shown in FIG. 7E. The interlayer dielectric layer L4 is formed, for example, by a process of depositing a dielectric material and a planarization process (for example, a chemical mechanical planarization process). As shown in FIG. 7E, a dielectric material is filled in a gap between the gate spacers 43 and the covering portion 31, and in the groove 52 formed in step S3-3 used for conductive contacts to be formed for the transistor.

Step S3-7: forming conductive contacts 44, 45 in the interlayer dielectric layer L4, as shown in FIG. 7F. Forming the conductive contacts 44, 45 may be performed by first forming a contacting via extending through the interlayer dielectric layer L4 and then filling the contacting via with a conductive material. The formed conductive contacts 44, 45 extend downward from the upper surface of the interlayer dielectric layer L4 and reach the gate electrode 32 of the transistor or the active regions of the transistor so that the filled conductive material may be coupled with the gate electrode 32 or the active regions. The conductive contact 45 for the active regions of the transistor may be formed in the groove 52 and not in contact with the covering portion 31.

Step S3-8: forming a metal interconnection layer L2 above the interlayer dielectric layer L4, so as to form an image sensor as shown in FIG. 6. The conductive contacts 44, 45 formed in Step S3-6 may thus be coupled to one or more external circuits through the metal 21 in the metal interconnection layer L2.

In the steps of these embodiments above, after forming the gate electrode 32, i.e., after Step S3-4, and before forming the interlayer dielectric layer L4, i.e., prior to Step S3-6, the gate electrode 32 may be doped, by ion implantation for example. For example, an implantation dose may be ranged from $1.0 \times 10^{15}$ cm$^{-2}$ to $3.0 \times 10^{15}$ cm$^{-2}$, so that a doping concentration of the doped ion impurities in the gate electrode 32 may be ranged from $1.0\times10^{20}$ cm$^{-3}$ to $1.0\times10^{21}$ cm$^{-3}$.

A method for manufacturing an image sensor as shown in FIG. 6 according to some exemplary embodiments of this disclosure has been described above with reference to FIGS. 7A, to 12. Other methods for manufacturing other image sensors according to some exemplary embodiments of this disclosure may be conceivable for those skilled in the art based on the above description.

While a structure of each image sensor has been shown in the accompanying drawings of the present disclosure in a form of fragmentary cross sections, an entire structure of each image sensor may be conceivable for those skilled in the art based on the description and accompanying drawings.

The term "A or B" used through the specification refers to "A and B" and "A or B" rather than meaning that A and B are exclusive, unless otherwise specified.

The terms "front," "back," "top," "bottom," "over," "under" and the like, as used herein, if any, are used for descriptive purposes and not necessarily for describing permanent relative positions. It should be understood that such terms are interchangeable under appropriate circumstances such that the embodiments of the disclosure described herein are, for example, capable of operation in other orientations than those illustrated or otherwise described herein.

The term "exemplary", as used herein, means "serving as an example, instance, or illustration", rather than as a "model" that would be exactly duplicated. Any implementation described herein as exemplary is not necessarily to be construed as preferred or advantageous over other implementations. Furthermore, there is no intention to be bound by any expressed or implied theory presented in the preceding technical field, background, summary or detailed description.

The term "substantially", as used herein, is intended to encompass any slight variations due to design or manufacturing imperfections, device or component tolerances, environmental effects and/or other factors. The term "substantially" also allows for variation from a perfect or ideal case due to parasitic effects, noise, and other practical considerations that may be present in an actual implementation.

In addition, the foregoing description may refer to elements or nodes or features being "connected" or "coupled" together. As used herein, unless expressly stated otherwise, "connected" means that one element/node/feature is electrically, mechanically, logically or otherwise directly joined to (or directly communicates with) another element/node/feature. Likewise, unless expressly stated otherwise, "coupled" means that one element/node/feature may be mechanically, electrically, logically or otherwise joined to another element/node/feature in either a direct or indirect manner to permit interaction even though the two features may not be directly connected. That is, "coupled" is intended to encompass both direct and indirect joining of elements or other features, including connection with one or more intervening elements.

In addition, certain terminology, such as the terms "first", "second" and the like, may also be used in the following description for the purpose of reference only, and thus are not intended to be limiting. For example, the terms "first", "second" and other such numerical terms referring to structures or elements do not imply a sequence or order unless clearly indicated by the context.

Further, it should be noted that, the terms "comprise", "include", "have" and any other variants, as used herein, specify the presence of stated features, integers, steps, operations, elements, and/or components, but do not preclude the presence or addition of one or more other features, integers, steps, operations, elements, components, and/or groups thereof.

In this disclosure, the term "provide" is intended in a broad sense to encompass all ways of obtaining an object, thus the expression "providing an object" includes but is not limited to "purchasing", "preparing/manufacturing", "disposing/arranging", "installing/assembling", and/or "ordering" the object, or the like.

Furthermore, those skilled in the art will recognize that boundaries between the above described operations are merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments. However, other modifications, variations and alternatives are also possible. The description and accompanying drawings are, accordingly, to be regarded in an illustrative rather than in a restrictive sense.

Although some specific embodiments of the present disclosure have been described in detail with examples, it should be understood by a person skilled in the art that the above examples are only intended to be illustrative but not to limit the scope of the present disclosure. The embodiments disclosed herein can be combined arbitrarily with each other, without departing from the scope and spirit of the present disclosure. It should be understood by a person skilled in the art that the above embodiments can be modified without departing from the scope and spirit of the present disclosure. The scope of the present disclosure is defined by the attached claims.

What is claimed is:

1. An image sensor, comprising:
   a semiconductor substrate in which a photodiode is formed;
   a metal interconnection layer located above the semiconductor substrate; and
   an absorption layer configured to absorb light travelling through the semiconductor substrate, wherein the absorption layer is located between the semiconductor substrate and the metal interconnection layer,
   wherein the absorption layer includes:
   a gate electrode in a gate structure of a transistor that serves for the photodiode; and
   a covering portion covering an upper surface of the semiconductor substrate, the covering portion being spaced apart from both the gate structure of the transistor and a conductive contact serving for the transistor,
   wherein the gate electrode and the covering portion are formed of the same semiconductor material.

2. The image sensor of claim 1, wherein an energy bandgap of the semiconductor material forming the absorption layer is smaller than an energy bandgap of a semiconductor material forming the semiconductor substrate.

3. The image sensor of claim 1, wherein the gate electrode and the covering portion are located in a common layer.

4. The image sensor of claim 3, wherein the gate electrode and the covering portion are formed by a common procedure.

5. The image sensor of claim 3, wherein the same semiconductor material is silicon-germanium.

6. The image sensor of claim 5, wherein a mole percentage of germanium in silicon-germanium is less than or equal to 30%.

7. A method for manufacturing an image sensor, comprising:
- forming an absorption layer above a semiconductor substrate, wherein the absorption layer is configured to absorb light travelling through the semiconductor substrate, and a photodiode is formed in the semiconductor substrate; and
- forming a metal interconnection layer above the absorption layer,
- wherein forming the absorption layer incudes:
- forming and patterning a semiconductor material layer covering an upper surface of the semiconductor substrate, such that a first portion of the semiconductor material layer is operable to be a gate electrode in a gate structure of a transistor that serves for the photodiode, and a second portion of the semiconductor material layer is spaced apart from both the gate structure of the transistor and a conductive contact serving for the transistor,
- wherein the first portion and the second portion compose the absorption layer.

8. The method of claim 7, wherein an energy bandgap of the semiconductor material forming the absorption layer is smaller than an energy bandgap of a semiconductor material forming the semiconductor substrate.

9. The method of claim 7, wherein the semiconductor material layer is formed of silicon-germanium.

10. The method of claim 9, wherein a mole percentage of germanium in silicon-germanium is less than or equal to 30%.

* * * * *